US012189522B2

(12) United States Patent
Cariello et al.

(10) Patent No.: US 12,189,522 B2
(45) Date of Patent: Jan. 7, 2025

(54) TECHNIQUES FOR SUSPEND OPERATIONS

(71) Applicant: Micron Technology, Inc., Boise, ID (US)

(72) Inventors: Giuseppe Cariello, Boise, ID (US); Justin Bates, Boise, ID (US); Ryan Hrinya, Boise, ID (US); Fulvio Rori, Boise, ID (US); Chiara Cerafogli, Boise, ID (US); Carmine Miccoli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 17/853,219

(22) Filed: Jun. 29, 2022

(65) Prior Publication Data
US 2024/0004787 A1    Jan. 4, 2024

(51) Int. Cl.
*G06F 12/02*    (2006.01)
(52) U.S. Cl.
CPC ...... *G06F 12/023* (2013.01); *G06F 2212/251* (2013.01)
(58) Field of Classification Search
None
See application file for complete search history.

(56) References Cited

U.S. PATENT DOCUMENTS

| | | | |
|---|---|---|---|
| 2005/0172086 A1* | 8/2005 | Kawai | G11C 16/3418 711/154 |
| 2006/0239080 A1* | 10/2006 | Li | G11C 11/5635 711/E12.041 |
| 2009/0254696 A1* | 10/2009 | Kasai | G11C 16/344 711/E12.008 |
| 2019/0050312 A1* | 2/2019 | Li | G11C 16/105 |
| 2022/0051739 A1* | 2/2022 | Hwang | G11C 16/30 |
| 2022/0310178 A1* | 9/2022 | Yang | G11C 16/3436 |

* cited by examiner

*Primary Examiner* — Charles Rones
*Assistant Examiner* — Ryan Dare
(74) *Attorney, Agent, or Firm* — Holland & Hart LLP

(57) ABSTRACT

Methods, systems, and devices for suspend operations are described. A memory device may perform a write operation including one or more programming phases and one or more verify phases. The memory device may receive a read command while performing the write operation and determine whether the verify phase of the write operation is complete. The memory device may suspend a performance of the write operation in response to determining that the verify phase of the write operation is complete. The memory device may transmit first information for the write operation from a first latch to a volatile memory device in response to suspending the performance of the write operation. The memory device may perform a read operation associated with the read command in response to suspending the performance of the write operation and transferring the first information.

25 Claims, 6 Drawing Sheets

TECHNIQUES FOR SUSPEND OPERATIONS

FIELD OF TECHNOLOGY

The following relates to one or more systems for memory, including techniques for suspend operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
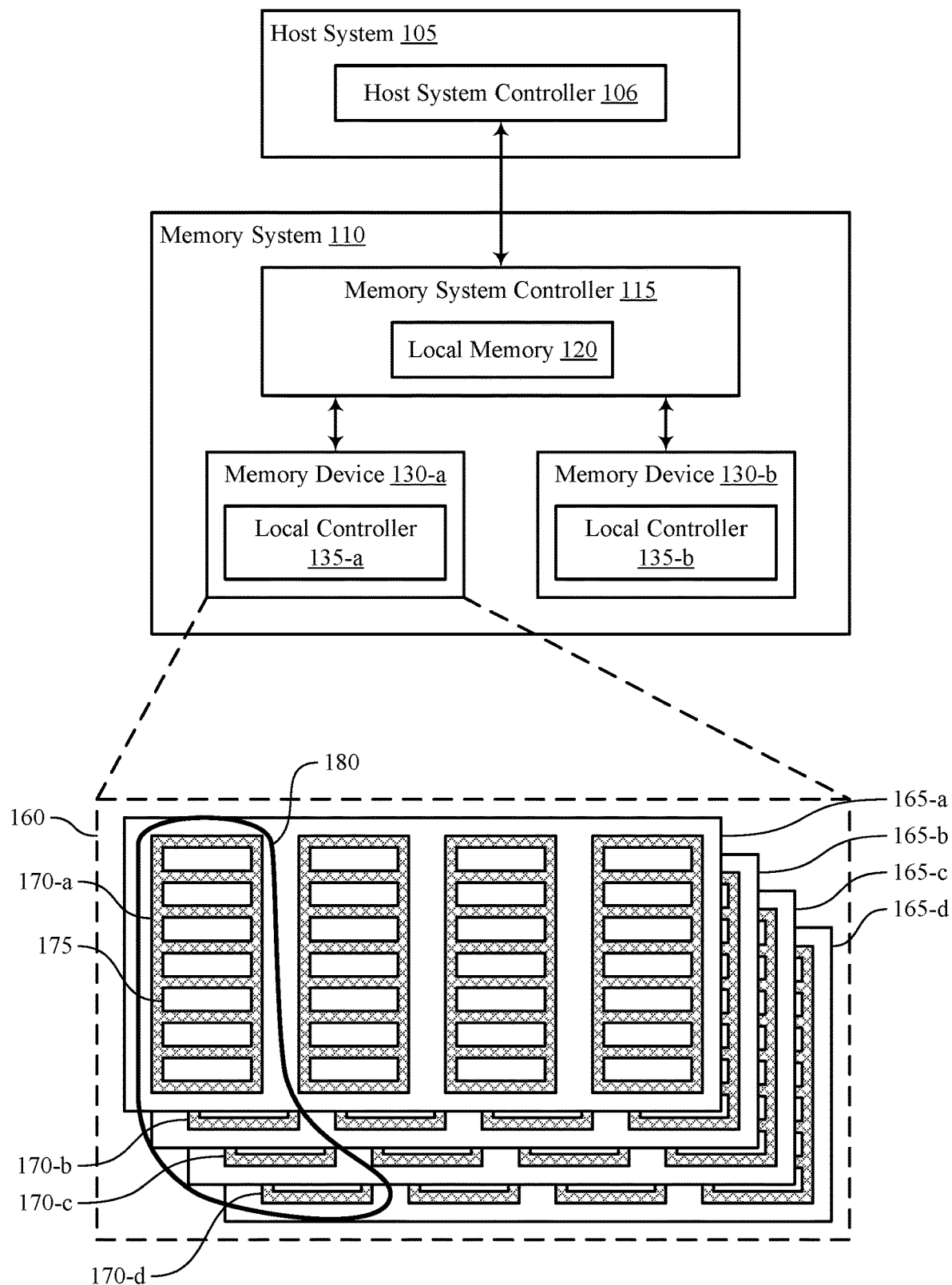
FIG. 1 illustrates an example of a system that supports techniques for suspend operations in accordance with examples as disclosed herein.

A memory device may perform a write operation (e.g., a programming operation) to store a logic state in a memory cell. The write operation may include one or more programming phases and one or more verify phases. A programming phase may include applying one or more pulses to the memory cell to store a logic state in the memory cell. A verify phase may include applying multiple (e.g., sequential) pulses to the memory cell to read the logic state stored in the memory cell and verify whether it is accurate. In some cases, a memory device may receive a command to perform an access operation with a higher priority than the write operation (e.g., a high-priority read operation). In some cases, the memory device may be configured to check (e.g., perform a firmware check) for commands (e.g., suspend commands, access commands) during the write operation (e.g., between each pulse included in a verify phase, after each programming pulse of a programming phase). To handle the higher priority commands, the memory system may implement a suspend operation for the write operation.

During a verify phase of the write operation, the memory device may determine if one or more previous programming pulses stored a desired logic state in a memory cell. If the verify phase indicates that the desired logic state is stored in the memory cell, the memory device may store information at an inhibit (INH) latch, a selective slow program convergence (SSPC) latch, or both. The inhibit latch may be used to prevent or inhibit future programming phases for that memory cell because the memory cell already stores the desired logic state. In some cases, the memory device may determine a voltage of a programming pulse that is part of a next programming phase in response to information determined during a verify phase. The memory device may refrain from applying additional pulses (e.g., programming pulses) or may determine to apply a soft pulse to the memory cell in response to the data stored at the INH latch, the SSPC latch, or both. For example, the memory device may read data stored in the INH latch and determine that a desired logic state is stored in the memory cell. Accordingly, the memory device may refrain from applying additional pulses to the memory cell (e.g., the memory device may inhibit the memory cell).

In some cases, a write operation may be suspended prior to a completion of a first verify phase of the write operation. In such cases, the first verify phase may not complete and the memory device may not store the data at either of the INH latch or the SSPC latch. The memory device may then resume the write operation, which may include entering a second verify phase. The memory device may enter the second verify phase to determine a voltage of a subsequent programming pulse. However, charge loss (e.g., quick charge loss (QCL)) may occur at the memory cell while the write operation is suspended. Accordingly, the memory device may enter the second verify phase and may determine that QCL has occurred. The memory device may determine to apply a soft pulse during a programming phase in response to determining that QCL has occurred. Applying the soft pulse may reduce a likelihood of programming an incorrect logic state at the memory cell due to overshoot or over programming. However, the second verify phase and the associated programming phase may increase a duration of the write program.

In accordance with aspects of the present disclosure, a memory device may be configured to avoid suspending write operations prior to a completion of a verify phase (e.g., during a verify phase or before a verify phase has started). For example, the memory device may receive a high-priority read command during a verify phase of a write operation and determine to complete the verify phase (e.g., apply one or more pulses for a duration of the verify phase). Accordingly, the memory device may avoid entering a verify phase upon resuming a write operation. As a result, a duration of the write operation (e.g., tprog) that is suspended may be reduced as compared to suspended write operations that start with verify phases. Additionally or alternatively, the memory device may update data stored in the INH latch in response to completing the verify phase, which may improve accuracy of future programming pulses (e.g., programming pulses applied after resuming the write operation). In some cases, the memory device may transfer SSPC data stored in a latch to a volatile memory device (e.g., a volatile memory device of a host system), which may enable the memory device to utilize the latch for other operations (e.g., a high-priority read operation). In some cases, the memory device may receive the SSPC data from the volatile memory device (and store it back in the latch) and resume the write operation without entering a verify phase upon resuming the write operation.

Features of the disclosure are initially described in the context of a system with reference to FIG. 1. Features of the disclosure are described in the context of a timing diagram and a process flow with reference to FIGS. 2 and 3. These and other features of the disclosure are further illustrated by and described in the context of an apparatus diagram and flowcharts that relate to techniques for suspend operations with reference to FIGS. 4 through 6.

FIG. 1 illustrates an example of a system 100 that supports techniques for suspend operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support techniques for suspend operations. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

The memory system 110 may perform write operations that include one or more programming phases and one or more verify phases. In some cases, the memory system 110 (e.g., the memory system controller 115, the local controller 135) may receive a command from the host system 105 (e.g., the host system controller 106) to store a logic value in a memory cell of the memory system 110. A programming phase may include applying one or more pulses to the memory cell of the memory system 110. A verify phase may include applying multiple pulses to the memory cell of the memory system 110. In some cases, the memory system 110 may receive a command to perform an access operation with a higher priority than the write operation (e.g., a high-priority read operation). In response to receiving the command to perform the access operation, the memory system 110 may implement a suspend operation, which may pause the write operation. However, in some cases, if a verify phase of the write operation has not completed (e.g., the write operation is suspended during a verify phase), the memory system 110 may not update information for resuming the write operation. Accordingly, suspending and resuming the write operation may result in increased use of processing resources associated with resuming the write operation.

In accordance with aspects of the present disclosure, the memory system 110 may be configured to avoid suspending write operations prior to a completion of a verify phase. In some cases, the memory system controller 115 or the local controller 135 may be configured to determine if a verify phase is complete and refrain from suspending a write operation if a suspend command is received and a verify phase is incomplete. Accordingly, the memory system 110 may conserve processing resources associated with resuming the suspend operation. For example, the memory system 110 may receive a suspend command, complete a verify phase, which may include updating information associated with the write operation, suspend the write operation, and resume the write operation without performing an additional verify phase prior to resuming the write operation. Additionally, completing the verify phase prior to suspending the write operation may include accuracy of future programming pulses that utilize information gleaned from the verify phase.

Figure 2:
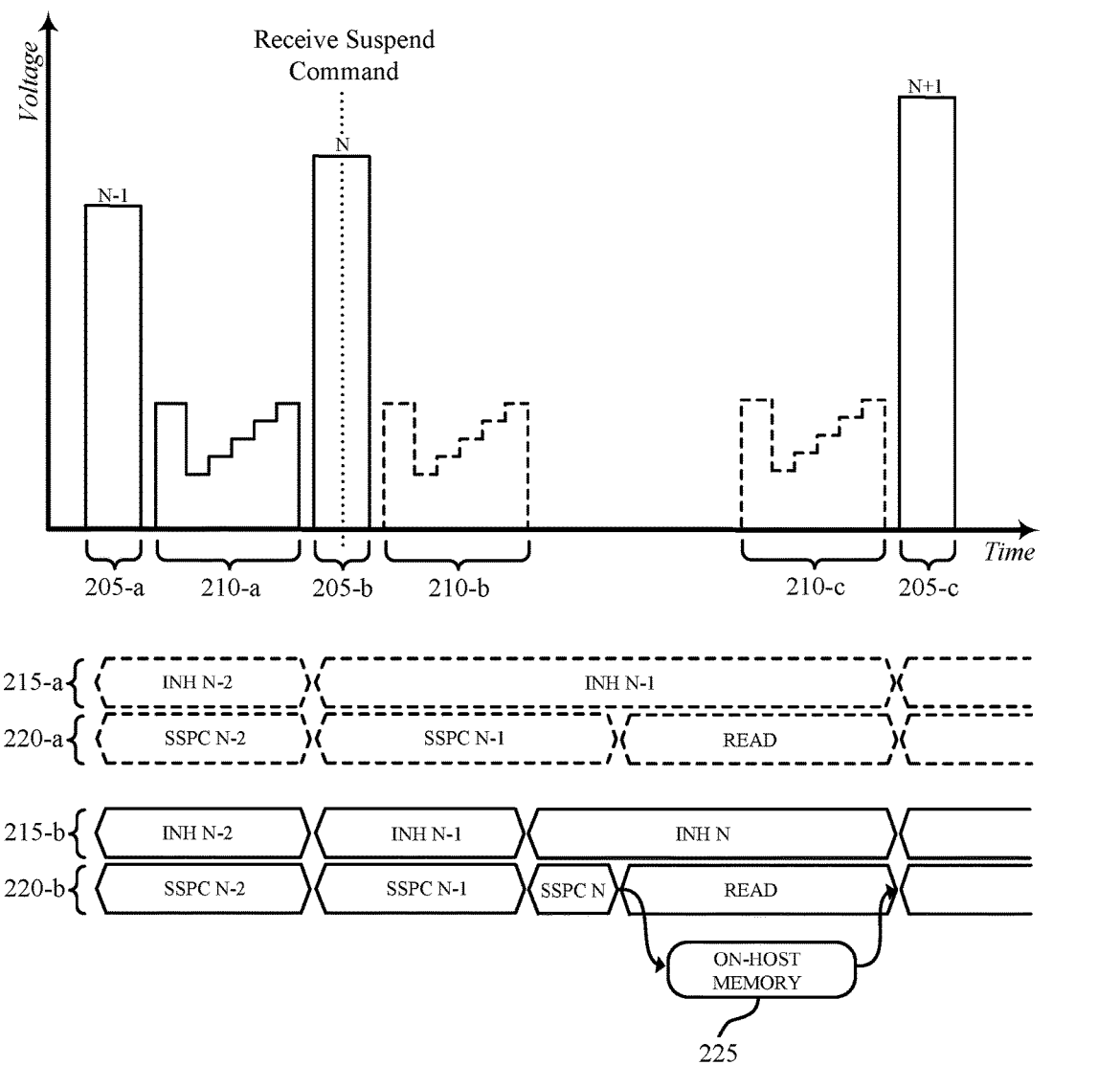
FIG. 2 illustrates an example of a timing diagram that supports techniques for suspend operations in accordance with examples as disclosed herein.

FIG. 2 illustrates an example of a timing diagram 200 that supports techniques for suspend operations in accordance with examples as disclosed herein. In some cases, one or more aspects of the timing diagram 200 may be implemented by one or more aspects of a system 100, as described with reference to FIG. 1. For example, a memory system 110, a memory system controller 115, a memory device 130, a local controller 135, as described with reference to FIG. 1, may implement one or more aspects of the timing diagram 200. The timing diagram 200 may include one or more programming phases 205 and one or more verify phases 210, which may be included in a write operation (e.g., a programming operation). Additionally or alternatively, the timing diagram 200 may include one or more INH latch process flows 215 and one or more SSPC latch process flows 220. The INH latch process flow 215-*a* and the SSPC latch process flow 220-*a* may correspond to suspending a write operation during a verify phase 210-*b*. The INH latch process flow 215-*b* and the SSPC latch process flow 220-*b* may correspond to suspending a write operation after a completion of the verify phase 210-*b*.

A write operation for programming a memory cell may include one or more programming phases 205 and one or more verify phases 210. A programming phase 205 may include applying a pulse to a memory cell. For example, a memory device may apply a voltage to an access line of a memory cell for a duration. In some cases, a programming phase 205-*a* may include applying a first voltage (e.g., a pulse) to a word line of a memory cell. The pulse applied to the memory cell during the programming phase 205-*a* may store a logic state in the memory cell. For example, the pulse may alter a physical property of the memory cell and the physical property may correspond to the logic state. In some cases, a verify phase 210-*a* may verify (e.g., confirm) a logic state stored in the memory cell is the desired logic state. For example, a verify phase 210-*a* may include a series of pulses, which may enable the memory device to determine if a logic state stored in the memory cell is the desired logic state. In some cases, one or more pulses included in the verify phase 210-*a* may be read pulses. The memory device may monitor for the occurrence of an event or a change in a state of the memory cell in response to one of more pulses included in a verify phase 210.

In some cases, multiple programming pulses and multiple verify pulses may be used to store a logic state in a memory cell. For example, a write operation may include multiple programming phases 205 and multiple verify phases 210. A write operation may include sequentially applying pulses with increasing voltages until a desired logic state is stored in one or more memory cells. For example, the programming phase 205-b may include a pulse with a higher voltage than the programming phase 205-a. Additionally or alternatively, the programming phase 205-c may include a pulse with a higher voltage than the programming phase 205-b. In some cases, a voltage of a programming pulse may correspond to information obtained during a verify phase 210. For example, a memory device may determine a voltage of a programming pulse in response to information from a verify phase 210. In some cases, the information from the verify phase 210 may indicate a voltage and may be stored in one or more latches of the memory device.

In some cases, the timing diagram 200 may include one or more pulses that are simultaneously applied to multiple memory cells (e.g., a block of memory cells, a page of memory cells, an array of memory cells). The write operation may include applying, to the multiple memory cells, a first pulse as part of the programming phase 205-a. The memory device may then apply, to the multiple memory cells, one or more second pulses during the verify phase 210-a. In response to the one or more second pulses applied during the verify phase 210-a, the memory device may determine if one or more of the multiple memory cells store a desired logic state. In some cases, if the desire logic state is stored in a memory cell, the memory device may inhibit future programming pulses from being applied to the memory cell. Additionally or alternatively, the memory device may inhibit future programming pulses from being applicated to a quantity of memory cells if the memory device determines that the quantity of memory cells store the desired logic states. Inhibiting a memory cell may include decoupling (e.g., isolating) the memory cell from the word line for subsequent programming pulses of the write operation. In some cases, a latch (e.g., an INH latch, an SSPC latch) may be used to store an indication of whether a memory cell stores a logic state, an indication of whether a memory cell is inhibited, or both.

In some cases, a write operation (e.g., programming operation) may be interrupted. For example, a memory device may suspend a write operation to perform a high-priority read operation. In some cases, the memory device may suspend the write operation in response to receiving a command, such as a suspend command or an access command. A suspend command may be received with a command to perform a high-priority access operation. In some other cases, a memory device may not receive a suspend command and may alternatively receive an access command, which may be for an access operation with a higher priority than a write operation. As described herein, the phrase receiving a suspend command may be used interchangeably with receiving a high-priority access command. In such examples, a memory device may initiate a suspend operation for a different operation based on receiving the high-priority access command. For example, a memory device may suspend a write operation in response to receiving a suspend command or receiving a high-priority access command.

A suspend command may be received at any point during a write operation. For example, the memory device may receive the suspend command during a programming phase 205 or during a verify phase 210. In some cases, the memory device may receive the suspend command between a programming phase 205 and an a verify phase 210. The memory device may perform an operation (e.g., perform a firmware check) to determine if a suspend command has been received. In some cases, the memory device may be configured to check for suspend commands at specific times within the write operation. For example, the memory device may be configured to check for a suspend command following a completion of a programming phase 205. Additionally or alternatively, the memory device may be configured to check for a suspend command after applying each pulse of a verify phase 210.

As described herein, a memory device may use information stored in a latch (e.g., an inhibit latch or an SSPC latch) to determine a voltage level of a programming pulse, however, the memory device may not update the latch until a verify phase 210 is complete. In some cases, the memory device may receive a suspend command prior to completing a verify phase 210. For example, a memory device may receive a suspend command during the verify phase 210-b or during a programming phase 205-b. If the write operation is suspended before the verify phase is complete, the memory device may suspend the write operation without updating the latch. To determine a voltage for a programming pulse the memory device may enter a verify phase 210. For example, the memory device may enter the verify phase 210-c to determine a voltage for a programming pulse applied during the programming phase 205-c.

In some cases, QCL (e.g., quick charge loss) may occur while the write operation is suspended. For example, one or more memory cells of the memory device may leak charge for a duration that the write operation is suspended. In some cases, the memory device may enter the verify phase 210-c to determine a voltage for a programming pulse applied during the programming phase 205-c. As a result of the QCL, the memory device may determine, during the verify phase 210-c, to apply a soft pulse during the programming phase 205-c. Applying the soft pulse during the programming phase 205-c may reduce a likelihood of programming an incorrect logic state at the memory cell due to overshoot or over programming.

Applying a soft pulse may include applying a programming pulse with a reduced voltage (e.g., a reduced voltage when compared to a previous programming pulse or a reduced voltage when compared to a previously determined voltage). The memory device may determine a value of the reduced voltage based on a duration that the write operation is suspended for, a quantity of quick charge loss, a preconfigured value, or any combination thereof. In some cases, a write operation may include applying multiple pulses with increasing voltages to a memory cell. That is, the programming phase 205-b may include applying a pulse to a memory cell with a higher voltage than a pulse applied during the programming phase 205-a. Additionally or alternatively, the programming phase 205-c may include applying a pulse to the memory cell with a higher voltage than a pulse applied during the programming phase 205-b. However, applying a soft pulse may include applying a pulse to a memory cell with a voltage lower than a pulse previously applied to the memory cell. For example, a memory device may determine to apply a soft pulse to a memory cell during the programming phase 205-c. The soft pulse may have a voltage lower than a pulse applied during the programming phase 205-b. In some cases, applying a soft pulse may be referred to as a "backed-up pulse."

In some other cases, applying a soft pulse may include applying a pulse with a reduced voltage when compared to a previously determined voltage. The previously determined voltage may be determined during a verify phase or may be determined based on a preconfigured value, a received indication, an algorithm for a write operation, or any other method for determining a voltage of a pulse. For example, a memory device may determine a voltage for a pulse to apply to a memory cell during the programming phase 205-c. However, the memory device may determine that QCL has occurred and determine to reduce a voltage for the pulse to avoid over programming the memory cell (e.g., to avoid overshoot). In some cases, a memory device may apply a hard pulse to a memory cell, which may include applying a pulse with an increased voltage (e.g., an increased voltage when compared to a previous programming pulse or an increased voltage when compared to a previously determined voltage).

As an illustrative example, a memory device may apply a pulse to a memory cell during the programming phase 205-a. The memory device may subsequently apply one or more pulses to the memory cell during the verify phase 210-a. During the programming phase 205-a and the verify phase 210-a one or more latches may store information associated with a previous pulse (e.g., in one or more inhibit latches, in one or more SSPC latches, or both). Upon completion of the verify phase 210-a, the one or more latches may be updated to store information associated with the pulse applied during the programming phase 205-a (e.g., pulse N−1). In a similar fashion, the memory device may update the one or more latches after completing the verify phase 210-b and the verify phase 210-c. For example, the memory device may complete the verify phase 210-b and update an INH latch and an SSPC latch to store information associated with the pulse applied during the programming phase 205-b.

In some cases, however, the memory device may receive a suspend command and may not complete a verify phase 210-b. For example, the memory device may receive a suspend command during the programming phase 205-b. The memory device may apply a pulse to a memory cell during the programming phase 205-b and may perform a firmware check after applying the pulse. As part of the firmware check, the memory device may detect the suspend command and may suspend the write operation in response to detecting the suspend command. For example, the memory device may not enter the verify phase 210-b. Accordingly, the memory device may not update one or more latches as shown by INH latch process flow 215-a and SSPC latch process flow 220-a. Upon resuming the write operation, the memory device may enter the verify phase 210-c to determine a voltage for a programming pulse to be applied during the programming phase 205-c. In some cases, the voltage for the programming pulse to be applied during the programming phase 205-c may be based on a voltage applied during the programming phase 205-b.

The memory device may receive a suspend command for a high-priority access operation. For example, the memory device may receive a suspend command to perform a high-priority read operation (or a higher-priority command as compared with the operation currently being performed). In some cases, the high-priority read operation may include reading information from a latch (e.g., an SSPC latch). The memory device may suspend the write operation in response to receiving the suspend command, perform a high-priority access operation and may resume the write operation. In some cases, the memory device resume the write operation with a verify phase 210. For example, the memory device may enter the verify phase 210-c prior to resuming the write operation.

However, the memory device may not be able determine a voltage of one or more pulses included in the programming phase 205-c from information stored in a latch that has not been updated. For example, prior to the programming phase 205-c, an INH latch may store information associated with a pulse applied to a memory cell during the programming phase 205-a. That is, the INH latch may not have been updated with information corresponding to the pulse applied during the programming phase 205-b. Accordingly, the memory device may determine to enter the verify phase 210-c to determine a voltage for a pulse to be applied during the programming phase 205-c. In some cases, during the verify phase 210-c, the memory device may determine to apply a soft pulse during a programming phase due to QCL having occurred. For example, applying the soft pulse may reduce a likelihood of programming an incorrect logic state at the memory cell due to overshoot or over programming. However, the verify phase 210-c and applying the soft pulse during the programming phase 205-c may increase a duration of the write program.

In accordance with aspects of the present disclosure, a memory device may be configured to complete a verify phase 210 prior to suspending a write operation. Accordingly, the memory device may update one or more latches prior to suspending the write operation and avoid entering the verify phase 210-c. For example, the memory device may receive a suspend command during the programming phase 205-b and may determine to complete the verify phase 210-b prior to suspending the write operation. Additionally or alternatively, the memory device may update one or more latches upon completion of the verify phase 210-b (e.g., prior to suspending the write operation).

While the write operation is suspended, the memory device may execute a high-priority access operation. The high-priority access operation may include using a latch (e.g., an SSPC latch) to store information. In some cases, the memory device may transfer information associated with the write operation stored at an SSPC latch to a volatile memory device 225 (e.g., located at a host device) prior to executing the high-priority access operation. For example, the memory device may transfer information associated with a programming pulse from an SSPC latch to a volatile memory device 225 prior to reading information from the SSPC latch. The memory device may perform the high-priority access operation and the information previously transferred to the volatile memory device 225 may be transferred back to the SSPC latch. In some cases, the volatile memory device 225 may be SRAM.

In some cases, the memory device may resume the write operation without the verify phase 210-c. For example, the memory device resume the write operation by applying a programming pulse to a memory cell as part of the programming phase 205-c. That is, the memory device may not apply one or more pulses as part of the verify phase 210-c. In such cases, the memory device may determine a voltage for the pulse applied as part of the programming phase 205-c in response to information stored in one or more latches. For example, the memory device may determine the voltage based on information stored in an INH latch.

Figure 3:
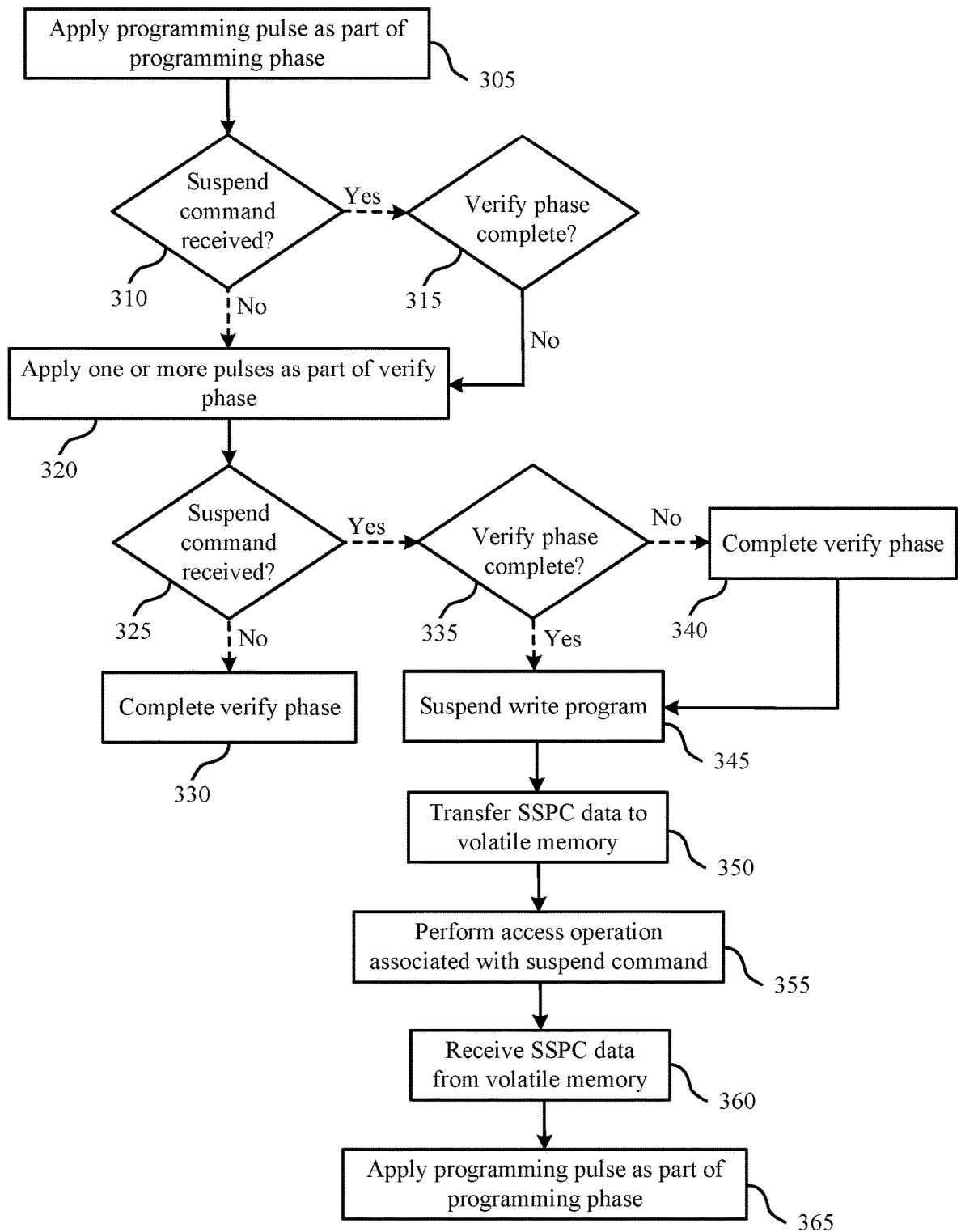
FIG. 3 illustrates an example of a process flow that supports techniques for suspend operations in accordance with examples as disclosed herein.

FIG. 3 illustrates an example of a process flow 300 that supports techniques for suspend operations in accordance with examples as disclosed herein. In some cases, one or more aspects of the process flow 300 may be implemented by one or more aspects of a system 100, as described with reference to FIG. 1. For example, a memory system 110, a memory system controller 115, a memory device 130, a local controller 135, as described with reference to FIG. 1, may implement one or more aspects of the process flow 300. Additionally or alternatively, aspects of the process flow 300 may be implemented as instructions stored in memory (e.g., firmware stored in a memory coupled with a memory system 110. For example, the instructions, when executed by a controller (e.g., the memory system controller 115), may cause the controller to perform the operations of the process flow 300. In the following description of the process flow 300, the operations may occur in a different order than the order shown, or the operations may be performed at different times. Some operations may also be left out of process flow 300, or other operations may be added to process flow 300. In some cases, the operations shown in the process flow 300 may be performed by a memory system.

At 305, a memory system may apply a programming pulse as part of a programming phase 205-b. In some cases, the programming phase 205-b may include one or more programming pulses. The memory system may apply the programming pulse at a voltage. The memory system may determine the voltage in response to information stored in a latch. For example, an INH latch may store information that indicates a voltage of a programming pulse. In some cases, the memory system may apply the programming pulse as part of a write operation, which may include one or more programming phases 205 and one or more verify phases 210.

At 310, the memory system may determine whether a suspend command has been received. For example, the memory system may perform one or more operations to determine if a suspend command has been received. The one or more operations may include a firmware check. In some cases, the memory system may generate the suspend command or may receive the suspend command from a host system 105. The suspend command may be for a high-priority access operation. For example, a read operation may have a higher priority than the write operation. Accordingly, the memory system may receive a suspend command to suspend the write operation while the memory system performs the high-priority access operation.

At 315, the memory system may determine if a verify phase 210-b is complete. For example, the memory system may determine if the verify phase 210-b is complete in response to determining that a suspend command is received. The verify phase 210-b may be for determining if the programming pulse applied at 305 has effectively stored a logic state in the memory cell. The memory system may enter the verify phase 210-b after the programming phase 205-b. At 315, the memory system may determine that the verify phase 210-b has not begun. Accordingly, the memory system may determine to enter the verify phase 210-b. If the memory system determines that the verify phase 210-b is complete, the memory system may suspend the write operation.

At 320, the memory system may apply one or more pulses (e.g., read pulses) as part of the verify phase 210-b. The one or more pulses may verify whether a logic state has been stored in a memory cell. In some cases, the one or more pulses may be read pulses. The memory system may determine a voltage of a verify pulse in response to information stored in a latch. In some cases, the memory system may apply one or more pulses with increasing voltages during the verify phase 210-b. Additionally or alternatively, the memory system may update information stored in one or more latches upon completion of the verify phase 210-b. For example, the memory system my update an INH latch, an SSPC latch, or both in response to completing the verify phase 210-b.

At 325, the memory system may determine if a suspend command has been received. Additionally or alternatively, the memory system may determine if an access command has been received (e.g., a high-priority access command). In some cases, the memory system may perform a firmware check to determine if the suspend command has been received. The memory system may be configured to perform a firmware check following each pulse of the verify phase 210-b. Accordingly, the memory system may determine if a suspend command has been received during the verify phase 210-b or after the verify phase 210-b.

At 330, if a suspend command has not been received, the memory system may complete the verify phase 210-b. For example, the memory system may not have completed the verify phase 210-b at 320. In some cases, completing the verify phase 210-b may include applying one or more pulses to a memory cell. The memory system may complete the verify phase 210-b and update information stored in one or more latches. For example, the memory system may complete the verify phase 210-b and store information in the one or more latches that indicates a logic state stored in one or more memory cells. In some cases, the memory system my store information in the one or more latches that indicates a voltage applied to the one or more memory cells.

At 335, if a suspend command has been received, the memory system may determine if a verify phase 210 is complete. For example, the memory system may determine if the verify phase 210-b is complete in response to determining that a suspend command is received. The verify phase 210-b may be for determining if the programming pulse applied at 305 has effectively stored a logic state in the memory cell. The memory system may enter the verify phase 210-b after applying the programming pulse as part of the programming phase 205-b.

At 340, if the memory system previously determined that the verify phase 210-b has not been completed, the memory system may complete the verify phase 210-b. For example, the memory system may not have completed the verify phase 210-b at 320. In some cases, completing the verify phase 210-b may include applying one or more pulses to a memory cell. The memory system may complete the verify phase 210-b and update information stored in one or more latches. For example, the memory system may complete the verify phase 210-b and store information in the one or more latches that indicates a logic state stored in one or more memory cells. In some cases, the memory system my store information in the one or more latches that indicates a voltage applied to the one or more memory cells.

At 345, if the memory system previously completed the verify phase 210-b or determined that the verify phase 210-b is complete, the memory system may suspend the write program. Suspending the write program may enable the memory system to perform one or more operations with a higher priority than the write program. For example, the memory system may perform one or more high-priority read operations while the write program is suspended. In some cases, the memory system may suspend the write program upon completion of the verify phase 210-b.

At 350, the memory system may transfer SSPC data to a volatile memory device 225. For example, the memory system may transfer information stored in an SSPC latch to SRAM. The memory system may transfer the SSPC data to the volatile memory device 225 so that the SSPC latch is available for a high-priority access operation. For example, the high-priority access operation may include reading data from the SSPC latch. The memory system may transfer the SSPC data to the voluntary memory system while the write operation is suspended. Accordingly, the memory system may not use the SSPC data while the write operation is suspended.

At 355, the memory system may perform an access operation for the suspend command. For example, the memory system may suspend the write operation so that the access operation can be performed. The access operation may include a high-priority read operation. In some cases, the access operation may include any operation with a priority higher than the write operation. In some cases, the access operation may include reading data from the SSPC latch.

At 360, the memory system may receive the SSPC data from a volatile memory device 225. In some cases, the volatile memory device 225 may be SRAM. Additionally or alternatively, the volatile memory system may be located at a host system 105. Accordingly, the memory system may receive the SSPC data from SRAM. The memory system may receive the SSPC data in response to completing the access operation associated with the suspend command. For example, the memory system may receive the SSPC data in response to completing a high-priority read operation, which may include reading information from the SSPC latch. In some cases, the memory system may receive the SSPC data prior to resuming the write operation.

At 365, the memory system may apply a programming pulse as part of a programming phase 205-*c*. In some cases, the programming pulse of the programming phase 205-*c* may have a higher voltage than the programming pulse of the programming phase 205-*b*. In some cases, the memory system may determine a voltage for the programming pulse of the programming phase 205-*c* based on data stored in a latch. For example, the memory system may determine a voltage for the programming pulse of the programming phase 205-*c* based on data stored in an INH latch, an SSPC latch, or both. The programming pulse of the programming phase 205-*c* may be applied in response to resuming the write operation.

Figure 4:
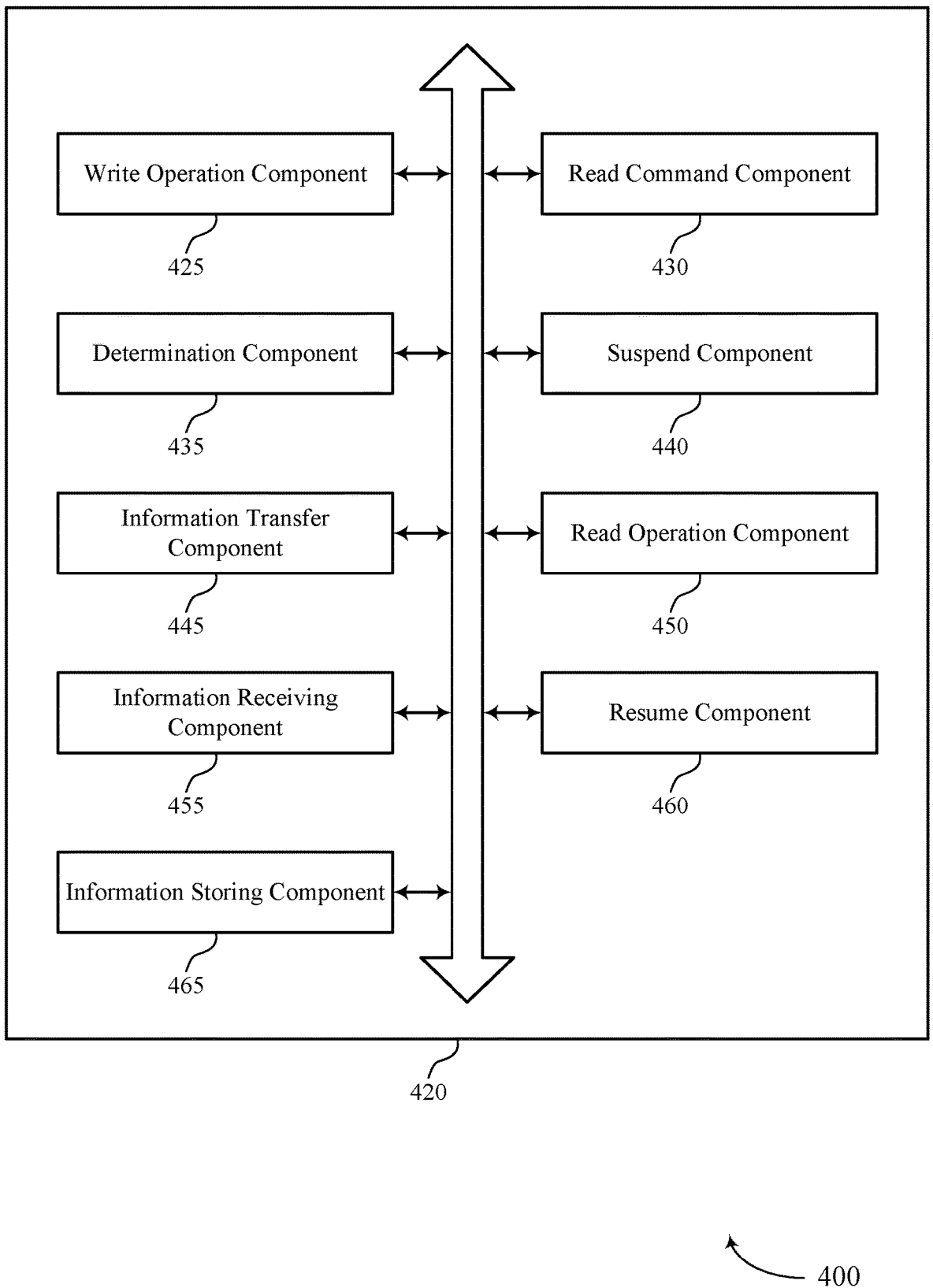
FIG. 4 illustrates an example of a memory device that supports techniques for suspend operations in accordance with examples as disclosed herein.

FIG. 4 shows a block diagram 400 of a memory system 420 that supports techniques for suspend operations in accordance with examples as disclosed herein. The memory system 420 may be an example of aspects of a memory system as described with reference to FIG. 1. The memory system 420, or various components thereof, may be an example of means for performing various aspects of techniques for suspend operations as described herein. For example, the memory system 420 may include a write operation component 425, a read command component 430, a determination component 435, a suspend component 440, an information transfer component 445, a read operation component 450, an information receiving component 455, a resume component 460, an information storing component 465, or any combination thereof. Each of these components may communicate, directly or indirectly, with one another (e.g., via one or more buses).

The write operation component 425 may be configured as or otherwise support a means for performing a write operation including one or more programming phases and one or more verify phases, where a verify phase of the one or more verify phases includes applying a plurality of pulses to a memory cell of a memory system. The read command component 430 may be configured as or otherwise support a means for receiving a read command based at least in part on performing the write operation. The determination component 435 may be configured as or otherwise support a means for determining whether the verify phase of the write operation is complete in response to receiving the read command. The suspend component 440 may be configured as or otherwise support a means for suspending a performance of the write operation based at least in part on determining that the verify phase of the write operation is complete. The information transfer component 445 may be configured as or otherwise support a means for transferring first information associated with the write operation from a first latch of the memory system to a volatile memory device based at least in part on suspending the performance of the write operation. The read operation component 450 may be configured as or otherwise support a means for performing a read operation associated with the read command based at least in part on suspending the performance of the write operation and transferring the first information.

In some examples, the information receiving component 455 may be configured as or otherwise support a means for receiving the first information for the write operation from the volatile memory device based at least in part on performing the read operation. In some examples, the resume component 460 may be configured as or otherwise support a means for resuming the write operation based at least in part on receiving the first information for the write operation from the volatile memory device.

In some examples, to support resuming the write operation, the resume component 460 may be configured as or otherwise support a means for applying, to the memory cell, a first pulse as part of a programming phase of the one or more programming phases.

In some examples, a first voltage amplitude of the first pulse applied to the memory cell as part of the programming phase that occurs after resuming the write operation is equal to a second voltage amplitude of the first pulse that occurs if an associated write operation is not suspended.

In some examples, the write operation resumes at a respective programming phase of the one or more programming phases and refrains from resuming at a respective verify phase of the one or more verify phases in response to resuming the write operation.

In some examples, to support performing the read operation, the read operation component 450 may be configured as or otherwise support a means for transferring, to a host system, second information stored in the first latch, the second information different from the first information.

In some examples, the information storing component 465 may be configured as or otherwise support a means for storing third information in a second latch based at least in part on the verify phase being complete, where the third information is stored in the second latch while the write operation is suspended.

In some examples, the second latch includes an inhibit latch configured to store the third information that indicates a voltage amplitude for the programming phase.

In some examples, the suspend component 440 may be configured as or otherwise support a means for receiving a suspend command from a host system to suspend the performance of the write operation, where suspending the performance of the write operation is based at least in part on receiving the suspend command.

In some examples, the first latch of the memory system includes a selective slow program convergence (SSPC) latch configured to store the first information associated with the write operation and second information associated with the read operation.

In some examples, a host system includes the volatile memory device.

In some examples, the read command is associated with a first priority and the write operation is associated with a second priority lower than the first priority.

Figure 5:
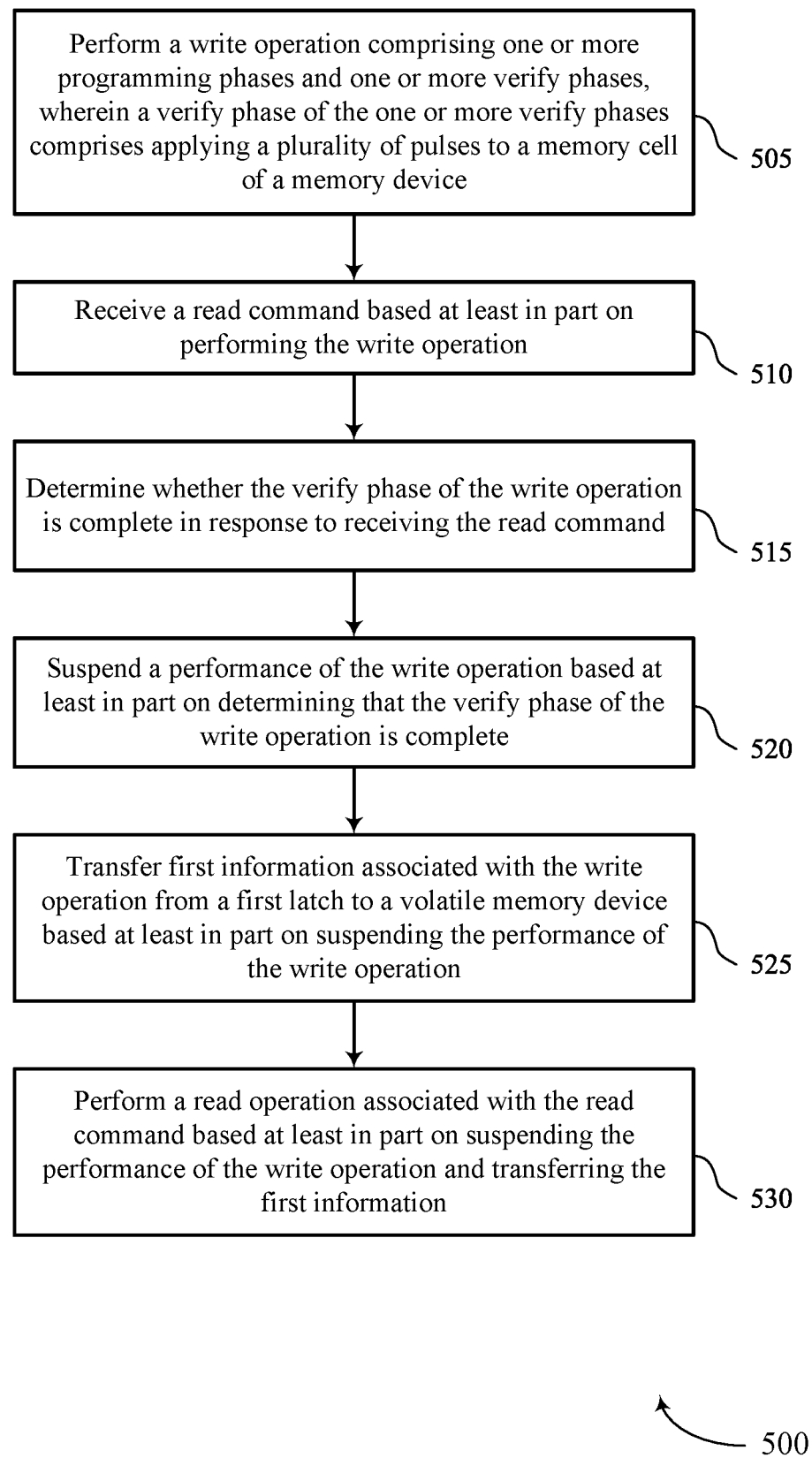
FIGS. 5 and 6 show flowcharts illustrating a method or methods that support techniques for suspend operations in accordance with examples as disclosed herein.

FIG. 5 shows a flowchart illustrating a method 500 that supports techniques for suspend operations in accordance with examples as disclosed herein. The operations of method 500 may be implemented by a memory system or its components as described herein. For example, the operations of method 500 may be performed by a memory system as described with reference to FIGS. 1 and 4. In some examples, a memory system may execute a set of instructions to control the functional elements of the device to perform the described functions. Additionally, or alternatively, the memory system may perform aspects of the described functions using special-purpose hardware.

At 505, the method may include performing a write operation including one or more programming phases and one or more verify phases, where a verify phase of the one or more verify phases includes applying a plurality of pulses to a memory cell of a memory device. The operations of 505 may be performed in accordance with examples as disclosed herein. In some examples, aspects of the operations of 505 may be performed by a write operation component 425 as described with reference to FIG. 4.

At 510, the method may include receiving a read command based at least in part on performing the write operation. The operations of 510 may be performed in accordance with examples as disclosed herein. In some examples, aspects of the operations of 510 may be performed by a read command component 430 as described with reference to FIG. 4.

At 515, the method may include determining whether the verify phase of the write operation is complete in response to receiving the read command. The operations of 515 may be performed in accordance with examples as disclosed herein. In some examples, aspects of the operations of 515 may be performed by a determination component 435 as described with reference to FIG. 4.

At 520, the method may include suspending a performance of the write operation based at least in part on determining that the verify phase of the write operation is complete. The operations of 520 may be performed in accordance with examples as disclosed herein. In some examples, aspects of the operations of 520 may be performed by a suspend component 440 as described with reference to FIG. 4.

At 525, the method may include transferring first information associated with the write operation from a first latch to a volatile memory device based at least in part on suspending the performance of the write operation. The operations of 525 may be performed in accordance with examples as disclosed herein. In some examples, aspects of the operations of 525 may be performed by an information transfer component 445 as described with reference to FIG. 4.

At 530, the method may include performing a read operation associated with the read command based at least in part on suspending the performance of the write operation and transferring the first information. The operations of 530 may be performed in accordance with examples as disclosed herein. In some examples, aspects of the operations of 530 may be performed by a read operation component 450 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing a write operation including one or more programming phases and one or more verify phases, where a verify phase of the one or more verify phases includes applying a plurality of pulses to a memory cell of a memory device; receiving a read command based at least in part on performing the write operation; determining whether the verify phase of the write operation is complete in response to receiving the read command; suspending a performance of the write operation based at least in part on determining that the verify phase of the write operation is complete; transferring first information associated with the write operation from a first latch to a volatile memory device based at least in part on suspending the performance of the write operation; and performing a read operation associated with the read command based at least in part on suspending the performance of the write operation and transferring the first information.

Aspect 2: The method, apparatus, or non-transitory computer-readable medium of aspect 1, further including operations, features, circuitry, logic, means, or instructions, or any combination thereof for receiving the first information for the write operation from the volatile memory device based at least in part on performing the read operation and resuming the write operation based at least in part on receiving the first information for the write operation from the volatile memory device.

Aspect 3: The method, apparatus, or non-transitory computer-readable medium of aspect 2 where resuming the write operation, further includes operations, features, circuitry, logic, means, or instructions, or any combination thereof for applying, to the memory cell, a first pulse as part of a programming phase of the one or more programming phases.

Aspect 4: The method, apparatus, or non-transitory computer-readable medium of aspect 3 where a first voltage amplitude of the first pulse applied to the memory cell as part of the programming phase that occurs after resuming the write operation is equal to a second voltage amplitude of the first pulse that occurs if an associated write operation is not suspended.

Aspect 5: The method, apparatus, or non-transitory computer-readable medium of any of aspects 2 through 4 where the write operation resumes at a respective programming phase of the one or more programming phases and refrains from resuming at a respective verify phase of the one or more verify phases in response to resuming the write operation.

Aspect 6: The method, apparatus, or non-transitory computer-readable medium of any of aspects 1 through 5 where performing the read operation, further includes operations, features, circuitry, logic, means, or instructions, or any combination thereof for transferring, to a host system, second information stored in the first latch, the second information different from the first information.

Aspect 7: The method, apparatus, or non-transitory computer-readable medium of any of aspects 1 through 6, further including operations, features, circuitry, logic, means, or instructions, or any combination thereof for storing third information in a second latch based at least in part on the verify phase being complete, where the third information is stored in the second latch while the write operation is suspended.

Aspect 8: The method, apparatus, or non-transitory computer-readable medium of aspect 7 where the second latch includes an inhibit latch configured to store the third information that indicates a voltage amplitude for the programming phase.

Aspect 9: The method, apparatus, or non-transitory computer-readable medium of any of aspects 1 through 8, further including operations, features, circuitry, logic, means, or instructions, or any combination thereof for receiving a suspend command from a host system to suspend the performance of the write operation, where suspending the performance of the write operation is based at least in part on receiving the suspend command.

Aspect 10: The method, apparatus, or non-transitory computer-readable medium of any of aspects 1 through 9 where the first latch includes a selective slow program convergence (SSPC) latch configured to store the first information associated with the write operation and second information associated with the read operation.

Aspect 11: The method, apparatus, or non-transitory computer-readable medium of any of aspects 1 through 10 where a host system includes the volatile memory device.

Aspect 12: The method, apparatus, or non-transitory computer-readable medium of any of aspects 1 through 11 where the read command is associated with a first priority and the write operation is associated with a second priority lower than the first priority.

Figure 6:
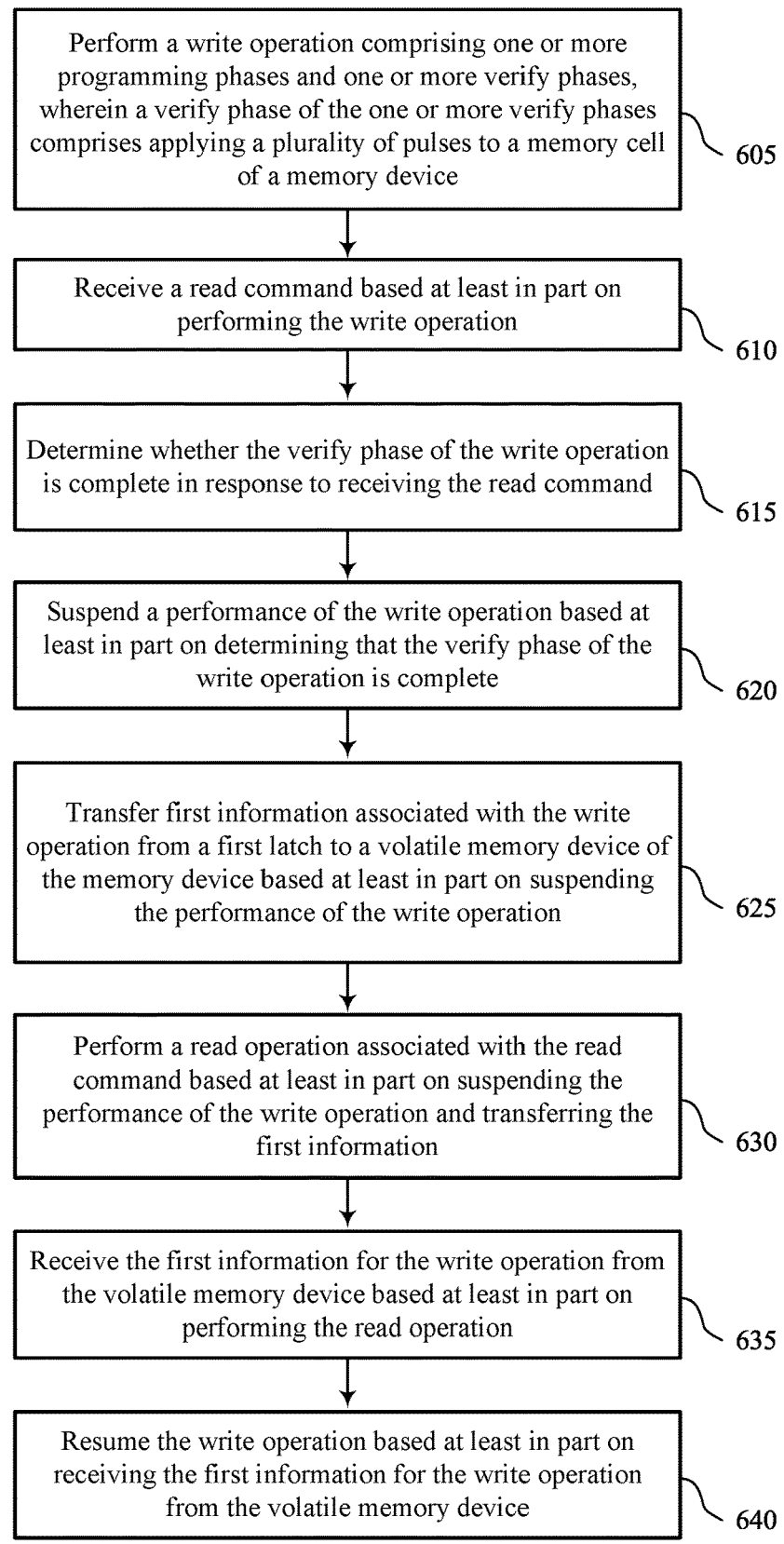

FIG. 6 shows a flowchart illustrating a method 600 that supports techniques for suspend operations in accordance with examples as disclosed herein. The operations of method 600 may be implemented by a memory system or its components as described herein. For example, the operations of method 600 may be performed by a memory system as described with reference to FIGS. 1 and 4. In some examples, a memory system may execute a set of instructions to control the functional elements of the device to perform the described functions. Additionally, or alternatively, the memory system may perform aspects of the described functions using special-purpose hardware.

At 605, the method may include performing a write operation including one or more programming phases and one or more verify phases, where a verify phase of the one or more verify phases includes applying a plurality of pulses to a memory cell of a memory device. The operations of 605 may be performed in accordance with examples as disclosed herein. In some examples, aspects of the operations of 605 may be performed by a write operation component 425 as described with reference to FIG. 4.

At 610, the method may include receiving a read command based at least in part on performing the write operation. The operations of 610 may be performed in accordance with examples as disclosed herein. In some examples, aspects of the operations of 610 may be performed by a read command component 430 as described with reference to FIG. 4.

At 615, the method may include determining whether the verify phase of the write operation is complete in response to receiving the read command. The operations of 615 may be performed in accordance with examples as disclosed herein. In some examples, aspects of the operations of 615 may be performed by a determination component 435 as described with reference to FIG. 4.

At 620, the method may include suspending a performance of the write operation based at least in part on determining that the verify phase of the write operation is complete. The operations of 620 may be performed in accordance with examples as disclosed herein. In some examples, aspects of the operations of 620 may be performed by a suspend component 440 as described with reference to FIG. 4.

At 625, the method may include transferring first information associated with the write operation from a first latch to a volatile memory device based at least in part on suspending the performance of the write operation. The operations of 625 may be performed in accordance with examples as disclosed herein. In some examples, aspects of the operations of 625 may be performed by an information transfer component 445 as described with reference to FIG. 4.

At 630, the method may include performing a read operation associated with the read command based at least in part on suspending the performance of the write operation and transferring the first information. The operations of 630 may be performed in accordance with examples as disclosed herein. In some examples, aspects of the operations of 630 may be performed by a read operation component 450 as described with reference to FIG. 4.

At 635, the method may include receiving the first information for the write operation from the volatile memory device based at least in part on performing the read operation. The operations of 635 may be performed in accordance with examples as disclosed herein. In some examples, aspects of the operations of 635 may be performed by an information receiving component 455 as described with reference to FIG. 4.

At 640, the method may include resuming the write operation based at least in part on receiving the first information for the write operation from the volatile memory device. The operations of 640 may be performed in accordance with examples as disclosed herein. In some examples, aspects of the operations of 640 may be performed by a resume component 460 as described with reference to FIG. 4.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
one or more memory devices; and
processing circuitry coupled with the one or more memory devices and configured to cause the memory system to:
  perform a write operation comprising one or more programming phases and one or more verify phases, wherein a verify phase of the one or more verify phases comprises applying a first plurality of pulses to a memory cell of each of the one or more memory devices, and wherein at least one pulse of the first plurality of pulses comprises a voltage amplitude different than one or more voltage amplitudes associated with one or more other pulses of the first plurality of pulses;
  receive a read command based at least in part on performing the write operation;
  determine whether the verify phase of the write operation is complete in response to receiving the read command;
  suspend a performance of the write operation based at least in part on determining that the verify phase of the write operation is complete;
  transfer first information associated with the write operation from a first latch to one or more volatile memory devices based at least in part on suspending the performance of the write operation;
  perform a read operation associated with the read command based at least in part on suspending the performance of the write operation and transferring the first information; and
  resume the write operation at a respective programming phase of the one or more programming phases after performing the read operation.

2. The memory system of claim 1, wherein the processing circuitry is further configured to cause the memory system to:
  receive the first information for the write operation from the one or more volatile memory devices based at least in part on performing the read operation, wherein resuming the write operation is based at least in part on receiving the first information for the write operation from the one or more volatile memory devices.

3. The memory system of claim 2, wherein, to resume the write operation, the processing circuitry is further configured to cause the memory system to:
  apply, to the memory cell, a first pulse as part of a programming phase of the one or more programming phases.

4. The memory system of claim 3, wherein a first voltage amplitude of the first pulse applied to the memory cell as part of the programming phase that occurs after resuming the write operation is equal to a second voltage amplitude of the first pulse that occurs if an associated write operation is not suspended.

5. The memory system of claim 1, wherein, to resume the write operation, the processing circuitry is further configured to cause the memory system to:
  refrain from resuming at a respective verify phase of the one or more verify phases in response to resuming the write operation.

6. The memory system of claim 1, wherein, to perform the read operation, the processing circuitry is further configured to cause the memory system to:

transfer, to a host system, second information stored in the first latch, the second information different from the first information.

7. The memory system of claim 1, wherein the processing circuitry is further configured to cause the memory system to:
store third information in a second latch based at least in part on the verify phase being complete, wherein the third information is stored in the second latch while the write operation is suspended.

8. The memory system of claim 7, wherein:
the second latch comprises an inhibit latch configured to store the third information that indicates a voltage amplitude for a programming phase of the one or more programming phases.

9. The memory system of claim 1, wherein the processing circuitry is further configured to cause the memory system to:
receive a suspend command from a host system to suspend the performance of the write operation, wherein to suspend the performance of the write operation is based at least in part on receiving the suspend command.

10. The memory system of claim 1, wherein:
the first latch comprises a selective slow program convergence (SSPC) latch configured to store the first information associated with the write operation and second information associated with the read operation.

11. The memory system of claim 1, wherein a host system comprises the one or more volatile memory devices.

12. The memory system of claim 1, wherein the read command is associated with a first priority and the write operation is associated with a second priority lower than the first priority.

13. A non-transitory computer-readable medium storing code comprising instructions which, when executed by processing circuitry of an electronic device, cause the electronic device to:
perform a write operation comprising one or more programming phases and one or more verify phases, wherein a verify phase of the one or more verify phases comprises applying a first plurality of pulses to a memory cell of the electronic device, and wherein at least one pulse of the first plurality of pulses comprises a voltage amplitude different than one or more voltage amplitudes associated with one or more other pulses of the first plurality of pulses;
receive a read command based at least in part on performing the write operation;
determine whether the verify phase of the write operation is complete in response to receiving the read command;
suspend a performance of the write operation based at least in part on determining that the verify phase of the write operation is complete;
transfer first information associated with the write operation from a first latch to one or more volatile memory devices based at least in part on suspending the performance of the write operation;
perform a read operation associated with the read command based at least in part on suspending the performance of the write operation and transferring the first information; and
resume the write operation at a respective programming phase of the one or more programming phases after performing the read operation.

14. The non-transitory computer-readable medium of claim 13, wherein the instructions, when executed by the processing circuitry of the electronic device, further cause the electronic device to:
receive the first information for the write operation from the one or more volatile memory devices based at least in part on performing the read operation, wherein resuming the write operation is based at least in part on receiving the first information for the write operation from the one or more volatile memory devices.

15. The non-transitory computer-readable medium of claim 14, wherein the instructions, when executed by the processing circuitry of the electronic device, further cause the electronic device to:
apply, to the memory cell, a first pulse as part of a programming phase of the one or more programming phases.

16. The non-transitory computer-readable medium of claim 15, wherein a first voltage amplitude of the first pulse applied to the memory cell as part of the programming phase that occurs after resuming the write operation is equal to a second voltage amplitude of the first pulse that occurs if an associated write operation is not suspended.

17. The non-transitory computer-readable medium of claim 13, wherein the instructions to resume the write operation, when executed by the processing circuitry of the electronic device, further cause the electronic device to:
refrain from resuming at a respective verify phase of the one or more verify phases in response to resuming the write operation.

18. The non-transitory computer-readable medium of claim 13, wherein the instructions to perform the read operation, when executed by the processing circuitry of the electronic device, further cause the electronic device to:
transfer, to a host system, second information stored in the first latch, the second information different from the first information.

19. The non-transitory computer-readable medium of claim 13, wherein the instructions, when executed by the processing circuitry of the electronic device, further cause the electronic device to:
store third information in a second latch based at least in part on the verify phase being complete, wherein the third information is stored in the second latch while the write operation is suspended.

20. The non-transitory computer-readable medium of claim 19, wherein the second latch comprises an inhibit latch configured to store the third information that indicates a voltage amplitude for a programming phase of the one or more programming phases.

21. The non-transitory computer-readable medium of claim 13, wherein the instructions, when executed by the processing circuitry of the electronic device, further cause the electronic device to:
receive a suspend command from a host system to suspend the performance of the write operation, wherein suspending the performance of the write operation is based at least in part on receiving the suspend command.

22. The non-transitory computer-readable medium of claim 13, wherein the first latch comprises a selective slow program convergence (SSPC) latch configured to store the first information associated with the write operation and second information associated with the read operation.

23. The non-transitory computer-readable medium of claim 13, wherein a host system comprises the one or more volatile memory devices.

24. The non-transitory computer-readable medium of claim 13, wherein the read command is associated with a first priority and the write operation is associated with a second priority lower than the first priority.

25. A method, comprising:

performing a write operation comprising one or more programming phases and one or more verify phases, wherein a verify phase of the one or more verify phases comprises applying a first plurality of pulses to a memory cell of each of one or more memory devices, and wherein at least one pulse of the first plurality of pulses comprises a voltage amplitude different than one or more voltage amplitudes associated with one or more other pulses of the first plurality of pulses;

receiving a read command based at least in part on performing the write operation;

determining whether the verify phase of the write operation is complete in response to receiving the read command;

suspending a performance of the write operation based at least in part on determining that the verify phase of the write operation is complete;

transferring first information associated with the write operation from a first latch to one or more volatile memory devices based at least in part on suspending the performance of the write operation;

performing a read operation associated with the read command based at least in part on suspending the performance of the write operation and transferring the first information; and resuming the write operation at a respective programming phase of the one or more programming phases after performing the read operation.

* * * * *